United States Patent
Shibata

(10) Patent No.: US 6,444,570 B2
(45) Date of Patent: Sep. 3, 2002

(54) METHOD OF MANUFACTURING A MULTI-LAYERED WIRING STRUCTURE FOR INTERCONNECTING SEMICONDUCTOR DEVICES BY PATTERNING RESIST AND ANTIREFLECTIVE FILMS TO DEFINE WIRING GROOVES

(75) Inventor: Hidenori Shibata, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/803,895

(22) Filed: Mar. 13, 2001

(30) Foreign Application Priority Data

Mar. 13, 2000 (JP) ........................................ 2000-069231
Feb. 21, 2001 (JP) ........................................ 2001-045331

(51) Int. Cl.[7] .............................................. H01L 21/32
(52) U.S. Cl. ...................... 438/636; 438/638; 438/763; 438/780; 438/782
(58) Field of Search ................................ 438/763, 780, 438/782, 636, 638

(56) References Cited

U.S. PATENT DOCUMENTS

| | | | |
|---|---|---|---|
| 5,883,006 A | | 3/1999 | Iba |
| 6,042,999 A | | 3/2000 | Lin et al. |
| 6,300,235 B1 | * | 10/2001 | Feldner et al. ............ 438/618 |
| 6,323,123 B1 | * | 11/2001 | Liu et al. ................... 438/638 |
| 2001/0008226 A1 | * | 7/2001 | Hung et al. ................ 216/18 |

* cited by examiner

Primary Examiner—Olik Chaudhuri
Assistant Examiner—Stephen W. Smoot
(74) Attorney, Agent, or Firm—Oblon, Spivak, McClelland, Maier & Neustadt, P.C.

(57) ABSTRACT

After a contact hole is filled with an antireflection film and a resist film, the resist film is patterned such that the resist film of an area larger than the opening of the portion where the contact hole is to be formed is left above the contact hole. The antireflection film is removed with the patterned resist film used as a mask, followed by forming a second interlayer film on the entire surface. The second interlayer film is planarized so as to expose at least the upper surface of the resist film to the outside. Then, the resist film and the antireflection film are removed so as to form a contact hole and a groove.

12 Claims, 6 Drawing Sheets

METHOD OF MANUFACTURING A MULTI-LAYERED WIRING STRUCTURE FOR INTERCONNECTING SEMICONDUCTOR DEVICES BY PATTERNING RESIST AND ANTIREFLECTIVE FILMS TO DEFINE WIRING GROOVES

CROSS-REFERENCE TO RELATED APPLICATIONS

This application is based upon and claims the benefit of priority from the prior Japanese Patent Applications No. 2000-069231, filed Mar. 13, 2000; and No. 2001-045331, filed Feb. 21, 2001, the entire contents of both of which are incorporated herein by reference.

BACKGROUND OF THE INVENTION

The present invention relates to a semiconductor device of a multi-layered wiring structure and a method of manufacturing the same.

In recent years, a Cu wiring has come to be used in the formation of a multi-layered wiring such as a logic article in accordance with miniaturization of the element.

A Cu wiring was formed in the past as follows. In the first step, a contact hole or a via hole is formed in an interlayer film, followed by filling the contact hole or the via hole with a metal film such as a W film. The metal film is planarized, followed by depositing again a metallic material for the wiring such as copper and subsequently patterning the deposited metal layer so as to form the wiring.

In recent years, however, a structure called a dual damascene structure has come to be employed in the Cu wiring. The dual damascene structure is a structure formed as follows. In the first step, a contact hole or a via hole and a groove corresponding to a wiring is formed in an interlayer film, followed by burying a metal film such as a copper film in the contact hole or in the via hole and the groove. The buried metal film is planarized by CMP (Chemical Mechanical Polish) so as to form a desired wiring.

The dual damascene structure described above includes a first method in which the contact hole is formed after formation of the groove and a second method in which the groove is formed after formation of the contact hole.

FIGS. 11 to 13 are cross sectional views collectively showing the method of manufacturing a semiconductor device by the first method noted above.

In the first step, a lower layer wiring 21 is selectively formed on an underlying substrate (not shown), followed by forming an interlayer film 22 on the entire surface and subsequently forming an organic antireflection film 23 on the interlayer film 22, as shown in FIG. 11. Further, the antireflection film 23 is coated with a resist film 24, followed by patterning the resist film 24. Still further, the antireflection film 23 and the interlayer film 22 are removed with the patterned resist film 24 used as a mask so as to form a groove 25. After formation of the groove 25, the resist film 24 is removed.

Then, an antireflection film 26 is formed again on the entire surface, followed by forming again a resist film 27 on the antireflection film 26, as shown in FIG. 12. As a result, the groove 25 is filled with the antireflection film 26 and the resist film 27. It should be noted that, since the groove 25 is formed in the interlayer film 22, the antireflection film 26 formed within the groove 25 fails to be made uniform in thickness. Further, the nonuniformity in the thickness of the antireflection film 26 causes the resist film 27 within the groove 25 to be nonuniform.

In the next step, the resist film 27 is patterned by lithography so as to form a contact hole 28 above the groove 25, as shown in FIG. 13.

In the first method of the conventional technology described above, it is necessary to pattern the resist film 27 to permit at least a part of the contact hole 28 to be positioned inside the groove 25. However, it is difficult to form a fine pattern of the contact hole 28 because that portion of the resist film 27 which is exposed to light is nonuniform in thickness.

FIGS. 14 to 17 are cross sectional views collectively showing a method of manufacturing a semiconductor device according to the second method of the conventional technology.

In the first step, a lower layer wiring 31 is selectively formed on an underlying substrate (not shown), followed by forming an interlayer film 32 on the entire surface and subsequently forming an organic antireflection film 33 on the interlayer film 32, as shown in FIG. 14. Then, the antireflection film 33 is coated with a resist film 34, followed by patterning the resist film 34. Further, the antireflection film 33 and the interlayer film 32 are removed with the patterned resist film 34 used as a mask so as to expose the surface of the lower layer wiring 31 to the outside. As a result, a contact hole 35 is formed in the interlayer film 32. Then, the resist film 34 and the antireflection film 33 are removed.

In the next step, an antireflection film 36 is formed again on the entire surface, as shown in FIG. 15. As a result, antireflection films 36a and 36b are formed on the interlayer film 32 and the lower layer wiring 31, respectively. Then, each of the antireflection films 36a and 36b is coated again with a resist film 37. It should be noted that, since the contact hole 35 has a high aspect ratio, the entire contact hole 35 is not filled completely with the antireflection film 36b. To be more specific, the bottom surface of the contact hole 35 is covered with the antireflection film 36b, and the resist film 37 is formed on the antireflection film 36b, thereby filling completely the contact hole 35.

Then, the resist film 37 is patterned by lithography, followed by removing the antireflection films 36a, 36b and an edge portion 32a of the interlayer film 32 with the patterned resist film 37 used as a mask, as shown in FIG. 16. In this case, the antireflection film 36b partly remains unremoved within the contact hole 35. The remaining antireflection film 36b serves to protect the bottom of the contact hole 35 in the subsequent step of forming a groove 38. Therefore, it is convenient for a part of the antireflection film 36 to remain unremoved within the contact hole 35.

In the next step, the interlayer film 32 and the antireflection film 36b are removed by an anisotropic etching such as RIE (Reactive Ion Etching) with the resist film 37 used as a mask so as to form the groove 38, as shown in FIG. 17. A side wall protective film 39 is formed on the side wall of each of the contact hole 35 and the groove 38 so as to maintain the anisotropy in performing the RIE treatment. As a result, after formation of the groove 38, a thin projecting portion, or fence, 40 of the interlayer film 32 extending along the side wall of the contact hole 35 is formed in the stepped portion between the contact hole 35 and the groove 38 under the influence of the side wall protective film 39.

As described above, in the second method of the conventional technology, the fence 40 is formed in forming the groove 38. What should be noted is that the fence 40 gives rise to the problem that the resistance between the contact hole 35 and a wiring (not shown) is increased or the region between the contact hole 35 and the wiring is rendered nonconductive. On the other hand, it is certainly possible to remove the fence 40 by the etching with, for example, a chemical solution. In this case, however, the groove 38 and the contact hole 35 are also etched, giving rise to the problem that the groove 38 and the contact hole 35 are enlarged.

As described above, in the first method of the conventional technology, it is difficult to pattern and process finely the resist film 27 in forming the contact hole 28 because the resist film 27 exposed to light in nonuniform in thickness. On the other hand, in the second method of the conventional technology, it is difficult to process finely the interlayer film 32 in forming the groove 38 because the surface to be etched (interlayer film 32) is not flat.

It follows that, in forming the wiring of a dual damascene structure by the conventional technology, it is difficult to process finely both the contact hole and the groove, though any of the contact hole and the groove may be processed finely.

BRIEF SUMMARY OF THE INVENTION

An object of the present invention, which has been achieved for resolving the above-noted problems, is to provide a semiconductor device that permits a fine processing for forming a contact hole and a groove, and a method of manufacturing the particular semiconductor device.

According to a first aspect of the present invention, which permits achieving the above-noted problems, there is provided a method of manufacturing a semiconductor device, comprising the steps of selectively forming a wiring on a semiconductor substrate; forming a first interlayer film on the entire surface; forming a first antireflection film on the first interlayer film; forming a first resist film on the first antireflection film; patterning the first resist film, followed by removing the first antireflection film and the first interlayer film with the patterned first resist film used as a mask so as to form a contact hole exposing the surface of the wiring to the outside; removing the first resist film; forming a second antireflection film on the entire surface so as to cover at least the bottom surface of the contact hole; forming a second resist film on the second antireflection film; patterning the second resist film to permit the second resist film to remain on the contact hole; removing the second antireflection film with the patterned second resist film used as a mask so as to expose the surface of the first interlayer film to the outside; forming a second interlayer film on the entire surface so as to cover the patterned second resist film and the second antireflection film; removing the second interlayer film so as to expose at least the entire surface of the patterned second resist film to the outside; and removing the patterned second resist film and the second antireflection film so as to form a groove in the second interlayer film.

In the manufacturing method of a semiconductor device according to the first aspect of the present invention, it is desirable for the second interlayer film to be formed of an SOG film of a coating type having a dielectric constant lower than that of the first interlayer film.

Also, in the manufacturing method of a semiconductor device according to the first aspect of the present invention, it is desirable for each of the first and second interlayer films to be formed of an organic film.

According to a second aspect of the present invention, there is provided a method of manufacturing a semiconductor device, comprising the steps of selectively forming a wiring on a semiconductor substrate; forming a first interlayer film on the entire surface; forming a first antireflection film on the first interlayer film; forming a first resist film on the first antireflection film; patterning the first resist film, followed by removing the first antireflection film and the first interlayer film with the patterned first resist film used as a mask so as to form a contact hole exposing the surface of the wiring to the outside; removing the first resist film; forming a lower film of a second antireflection film on the entire surface so as to fill the contact hole; forming an upper film of the second antireflection film on the lower film of the second antireflection film; forming a second resist film on the upper film of the second antireflection film; patterning the second resist film to permit the second resist film to remain on the contact hole; patterning the upper film of the second antireflection film with the patterned second resist film used as a mask; patterning the lower film of the second antireflection film with the patterned upper film of the second antireflection film used as a mask so as to expose the surface of the first interlayer film to the outside; forming a second interlayer film on the entire surface so as to cover the upper film and the lower film of the second antireflection film; removing the second interlayer film and the upper film of the second antireflection film so as to expose at least the entire upper surface of the lower film of the second antireflection film; and removing the lower film of the second antireflection film so as to form a groove in the second interlayer film.

In the manufacturing method of a semiconductor device according to the second aspect of the present invention, it is desirable for each of the second interlayer film and the upper film of the second antireflection film to be formed of an SOG film.

Also, in the manufacturing method of a semiconductor device according to the second aspect of the present invention, it is desirable for the second interlayer film to be formed of a film having a dielectric constant lower than that of the first interlayer film and to consist of a film of a coating type.

Also, in the manufacturing method of a semiconductor device according to the second aspect of the present invention, it is desirable for the lower film of each of the first antireflection film and the second antireflection film to be formed of an organic film.

Also, in the manufacturing method of a semiconductor device according to the second aspect of the present invention, it is possible for the upper film and the lower film of the second antireflection film to be patterned collectively with the patterned second resist film used as a mask.

Further, in the manufacturing method of a semiconductor device according to the second aspect of the present invention, it is possible for the second interlayer film to be formed with the second resist film left unremoved and for the second resist film to be removed together with the second interlayer film and the upper film of the second antireflection film in the step of exposing at least the entire upper surface of the lower film of the second antireflection film to the outside.

According to a third aspect of the present invention, there is provided a semiconductor device, comprising a wiring formed selectively on a semiconductor substrate; a first interlayer film formed on the semiconductor substrate; a second interlayer film formed on the first interlayer film; a contact hole formed in the first interlayer film and exposing the surface of the wiring to the outside; and a groove formed in the second interlayer film positioned above the contact hole and having an opening larger than the opening of the contact hole.

In the semiconductor device according to the third aspect of the present invention, it is desirable for the second interlayer film to be formed of an SOG film of a coating type having a dielectric constant lower than that of the first interlayer film.

As described above, the present invention provides a semiconductor device that permits a fine processing in forming a contact hole and a groove and a method of manufacturing the particular semiconductor device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
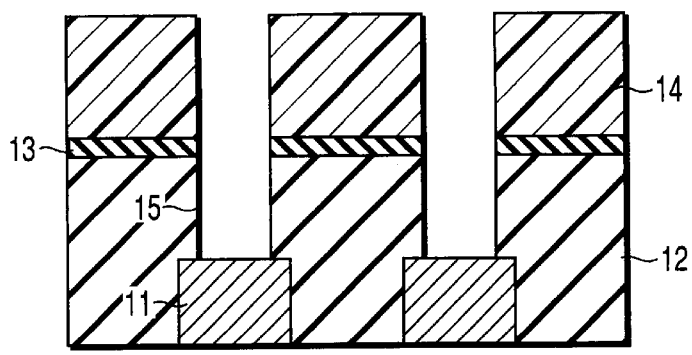
FIG. 1 is a cross sectional view showing a manufacturing step of a semiconductor device according to a first embodiment of the present invention.

Some embodiments of the present invention will now be described with reference to the accompanying drawings. Throughout the drawings, common portions are denoted by the common reference numerals.

[First Embodiment]

The first embodiment permits decreasing the number of patterning steps and processing steps and also permits forming a fine contact hole and a fine groove in forming a contact hole and a groove of a dual damascene structure.

FIGS. 1 to 5 are cross sectional views collectively showing a method of manufacturing a semiconductor device according to the first embodiment of the present invention. The manufacturing method of a semiconductor device according to the first embodiment of the present invention will now be described with reference to FIGS. 1 to 5.

In the first step, a lower layer wiring 11 is selectively formed on an underlying substrate (not shown) such as a semiconductor substrate, followed by forming a first interlayer film 12 on the entire surface, and subsequently forming an organic antireflection film 13 on the first interlayer film 12, as shown in FIG. 1. Then, the antireflection film 13 is coated with a resist film 14, followed by patterning the resist film 14. Further, the antireflection film 13 and the first interlayer film 12 are removed by RIE (Reactive Ion Etching) with the patterned resist film 14 used as a mask so as to expose a part of the surface of the lower layer wiring 11 to the outside. As a result, a contact hole 15 is formed in the first interlayer film 12. Then, the resist film 14 and the antireflection film 13 are removed.

Figure 2:
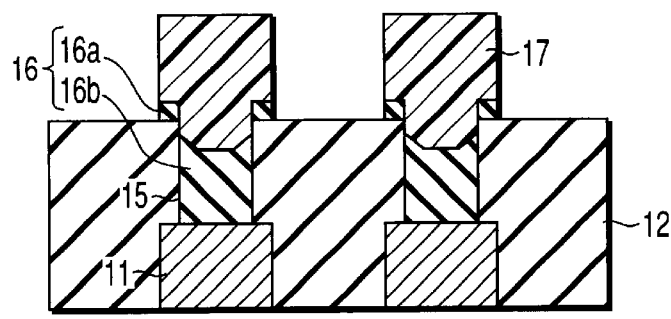
FIG. 2 is a cross sectional view showing a manufacturing step following the step shown in FIG. 1 of a semiconductor device according to the first embodiment of the present invention.

In the next step, an organic antireflection film 16 is formed again on the entire surface. As a result, antireflection films 16a and 16b are formed on the first interlayer film 12 and the lower layer wiring 11, respectively, as shown in FIG. 2. Then, the antireflection films 16a, 16b are coated again with a resist film 17, with the result that the contact hole 15 is filled with the antireflection film 16b and the resist film 17. After coating of the resist film 17, the resist film 17 is patterned by lithography to form the shape of a groove 19 referred to later. To be more specific, the resist film 17 is patterned such that a surface area larger than the opening of the contact hole 15 remains above the contact hole 15. Then, the antireflection film 16a is removed by RIE with the patterned resist film 17 used as a mask.

Figure 3:
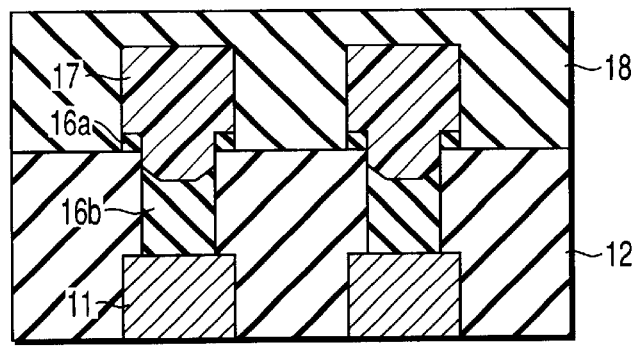
FIG. 3 is a cross sectional view showing a manufacturing step following the step shown in FIG. 2 of a semiconductor device according to the first embodiment of the present invention.
Figure 4:
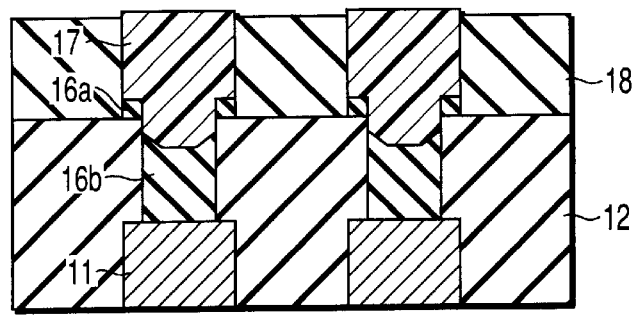
FIG. 4 is a cross sectional view showing a manufacturing step following the step shown in FIG. 3 of a semiconductor device according to the first embodiment of the present invention.

In the next step, a second interlayer film 18 is formed on the entire surface, with the patterned resist film 17 left unremoved, as shown in FIG. 3. As a result, the resist film 17 and the antireflection film 16a are covered completely with the second interlayer film 18. It should be noted that the second interlayer film 18 is formed of a film having a low dielectric constant such as an SOG (Spin On Glass) film of a coating type. The second interlayer film 18 thus formed is planarized by CMP (Chemical Mechanical Polish) so as to expose at least the entire upper surface of the resist film 17, as shown in FIG. 4.

Figure 5:
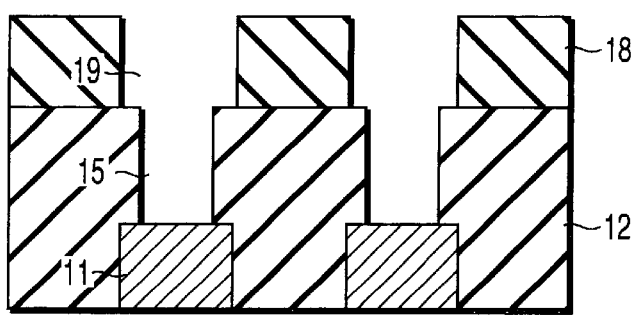
FIG. 5 is a cross sectional view showing a manufacturing step following the step shown in FIG. 4 of a semiconductor device according to the first embodiment of the present invention.

Finally, the resist film 17 and the antireflection films 16a, 16b are removed by ashing or treatment with a chemical solution, e.g., a chemical solution consisting of sulfuric acid and hydrogen peroxide solution, so as to form the groove 19 referred to previously in the second interlayer film 18, as shown in FIG. 5.

According to the first embodiment described above, both the patterning and processing are carried out in only the step for forming the contact hole 15 shown in FIG. 1 and the step for patterning the resist film 17 in the shape of the groove 19 shown in FIG. 2. In the former step, the resist film 14 is patterned relative to the flat surface of the antireflection film 13, and in the latter step, the resist film 17 is patterned relative to the flat surface of the interlayer film 12. It follows that it is possible to achieve a fine processing for forming each of the contact hole 15 and the groove 19. What should also be noted is that a fence is not formed around the contact hole 15. It follows that the problem such as an increase of the resistance and non-conductance does not take place in the region between the contact hole and the wiring.

It should also be noted that the second interlayer film 18 in which the groove 19 is formed is formed of a film having a low dielectric constant such as an SOG film, making it possible to lower the capacitance between the lower layer wiring 11 and an upper wiring (not shown). Further, the second interlayer film 18 is formed of a film of a coating type, with the result that it is possible to cover the resist film 17 without fail even in the case of forming the second interlayer film 18 on the stepped surface such as the patterned resist film 17.

Also, patterning and processing are not employed for forming the groove 19. To be more specific, the groove 19 is formed by burying the interlayer film 18 in the resist film 17 patterned in the shape of the groove 19, followed by removing the resist film 17. It follows that the patterning and processing steps are employed in only the process of forming the contact hole 15. What should be noted is that it is possible to decrease the number of RIE steps requiring a high degree of technology so as to facilitate the formation of a multi-layered wiring and to shorten the processing time. Further, since a costly apparatus such as a RIE apparatus is used less frequently, it is possible to suppress the increase in the manufacturing cost in the case where renewal of the apparatus is required in response to the demands for a further miniaturized processing in the future.

Incidentally, the second interlayer film 18 is not limited to. a film having a low dielectric constant such as an SOG film as far as the second interlayer film 18 does not denature or deform the antireflection film 16 or the resist film 17.

Also, CMP was employed in the first embodiment described above for planarizing the second interlayer film 18. However, it is also possible to employ an etch back method. Further, it is possible to employ an isotropic etching such as a wet etching after the second interlayer film 18 is planarized by CMP or the etch back not to expose the resist film 17 to the outside.

It is also possible for the first interlayer film 12 to be formed of a film having a low dielectric constant like the second interlayer film 18. In this case, it is desirable for the second interlayer film 18 to be formed of a film having a dielectric constant lower than that of the first interlayer film 12. In this case, it is possible to further decrease the capacitance between the lower layer wiring 11 and the upper layer wiring (not shown) and to decrease the capacitance around, particularly, the groove 19.

[Second Embodiment]

The second embodiment permits forming a fine and deep groove in a dual damascene structure.

FIGS. 6 to 10 are cross sectional views collectively showing a method of manufacturing a semiconductor device according to the second embodiment of the present invention. The manufacturing method of a semiconductor device according to the second embodiment of the present invention will now be described with reference to FIGS. 6 to 10. Incidentally, the overlapping steps between the first and second embodiments such as the steps up to formation of the contact hole 15 in the first interlayer film 12 are omitted in the following description.

Figure 6:
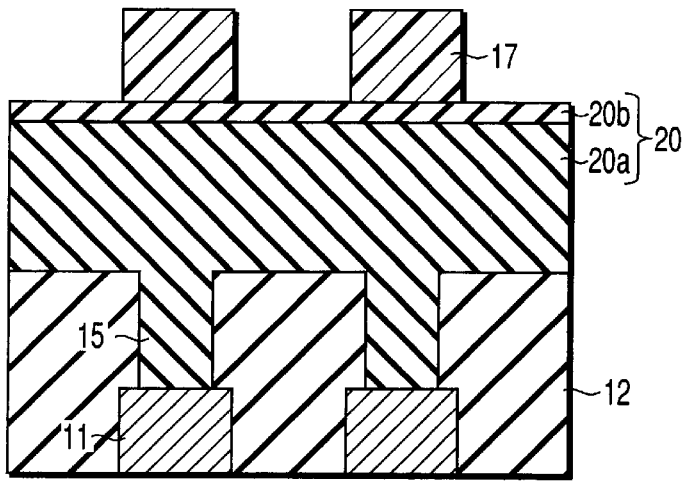
FIG. 6 is a cross sectional view showing a manufacturing step of a semiconductor device according to a second embodiment of the present invention.

As shown in FIG. 6, the contact hole 15 exposing a part of the surface of the lower layer wiring 11 to the outside is formed in the first interlayer film 12 by the method similar to that employed in the first embodiment described previously. Then, an antireflection film 20 is formed on the entire surface, followed by coating the antireflection film 20 with the resist film 17 and subsequently patterning the resist film 17. The antireflection film 20 is of a laminate structure consisting of a lower film 20a and an upper film 20b. The lower film 20a consists of an organic film made of, for example, a novolak resin, with the upper film 20b consisting of, for example, an SOG film.

As apparent from the description given above, the second embodiment differs from the first embodiment in that the thickness of the lower film 20a is increased so as to fill completely the contact hole 15, and that the upper film 20b is formed on the lower film 20a.

Figure 7:
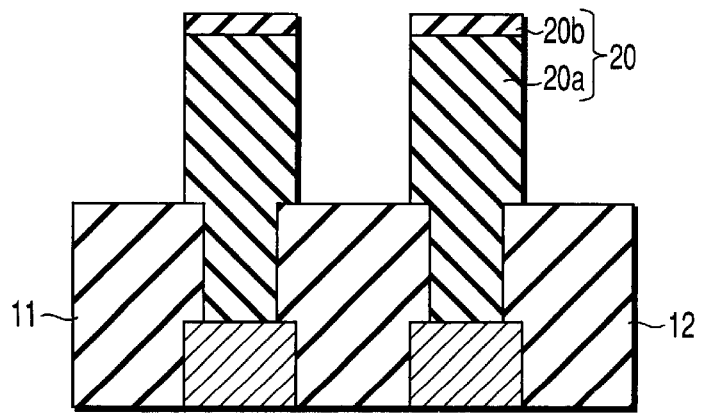
FIG. 7 is a cross sectional view showing a manufacturing step following the step shown in FIG. 6 of a semiconductor device according to the second embodiment of the present invention.

In the next step, the upper film 20b is patterned by RIE with the patterned resist film 17 used as a mask, as shown in FIG. 7, followed by patterning the lower film 20a with the patterned upper film 20b used as a mask. It should be noted that, in processing the lower film 20a, the upper film 20b having the pattern of the resist film 17 transferred thereto is used as a substantial mask. It follows that it suffices for the resist film 17 to have a thickness sufficient for enabling the resist film 17 to perform the function of a mask in the step of processing at least the upper film 20b. Incidentally, it is possible to pattern the upper film 20b and the lower film 20a simultaneously by using the patterned resist film 17 as a mask.

Figure 8:
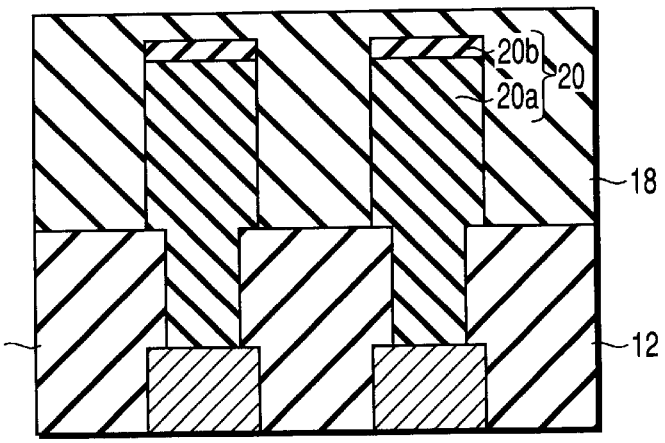
FIG. 8 is a cross sectional view showing a manufacturing step following the step shown in FIG. 7 of a semiconductor device according to the second embodiment of the present invention.

In the next step, the second interlayer film 18 is formed on the entire surface with the patterned lower film 20a and upper film 20b left unremoved, as shown in FIG. 8. As a result, the patterned lower film 20a and upper film 20b are filled completely with the second interlayer film 18. The second interlayer film 18 is formed of a film having a low dielectric constant such as an SOG film of a coating type.

Figure 9:
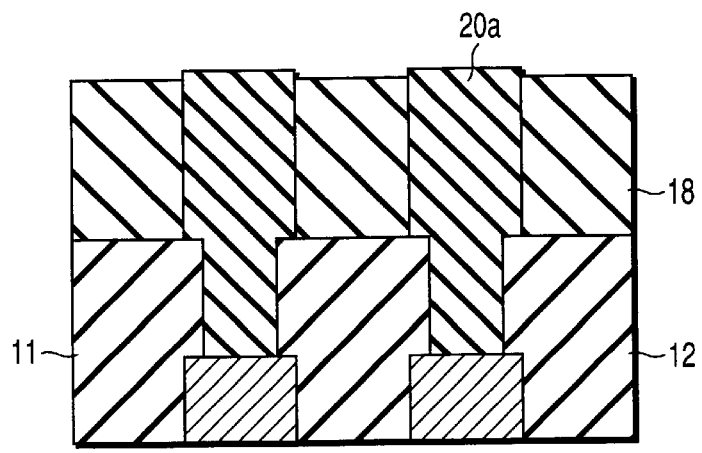
FIG. 9 is a cross sectional view showing a manufacturing step following the step shown in FIG. 8 of a semiconductor device according to the second embodiment of the present invention.

Then, the second interlayer film 18 and the upper film 20b are removed by CMP or etch back so as to expose at least the entire surface of the lower film 20a, as shown in FIG. 9.

Figure 10:
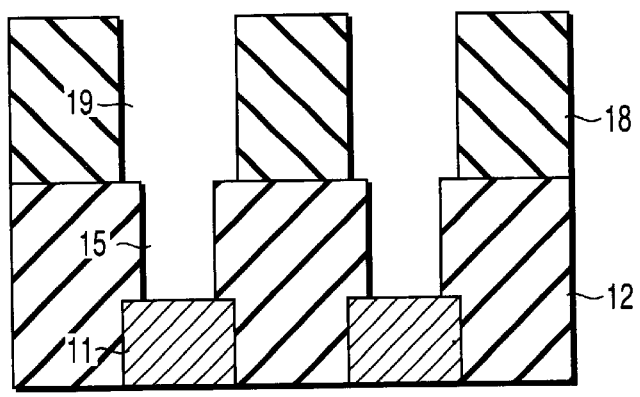
FIG. 10 is a cross sectional view showing a manufacturing step following the step shown in FIG. 9 of a semiconductor device according to the second embodiment of the present invention.
Figure 11:
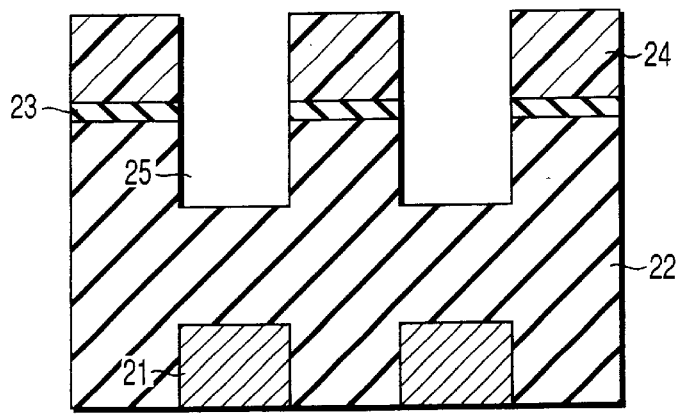
FIG. 11 is a cross sectional view showing a manufacturing step of a semiconductor device according to a first method of the conventional technology.
Figure 12:
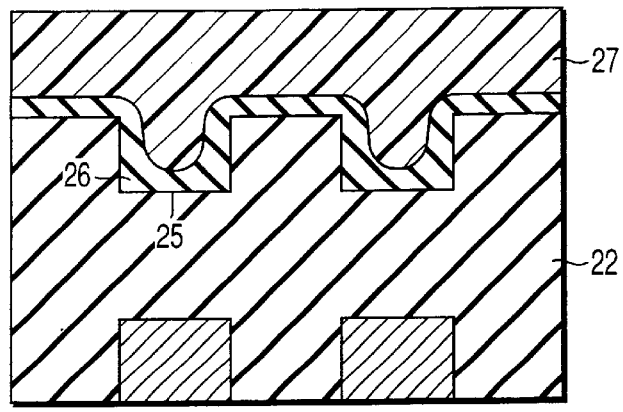
FIG. 12 is a cross sectional view showing a manufacturing step following the step shown in FIG. 11 of a semiconductor device according to the first method of the conventional technology.
Figure 13:
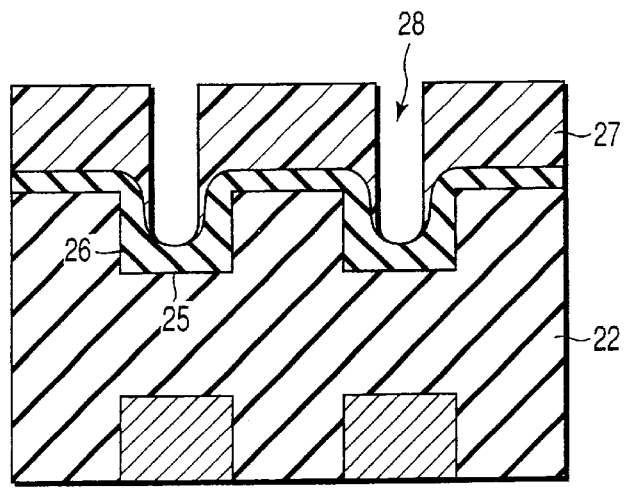
FIG. 13 is a cross sectional view showing a manufacturing step following the step shown in FIG. 12 of a semiconductor device according to the first method of the conventional technology.
Figure 14:
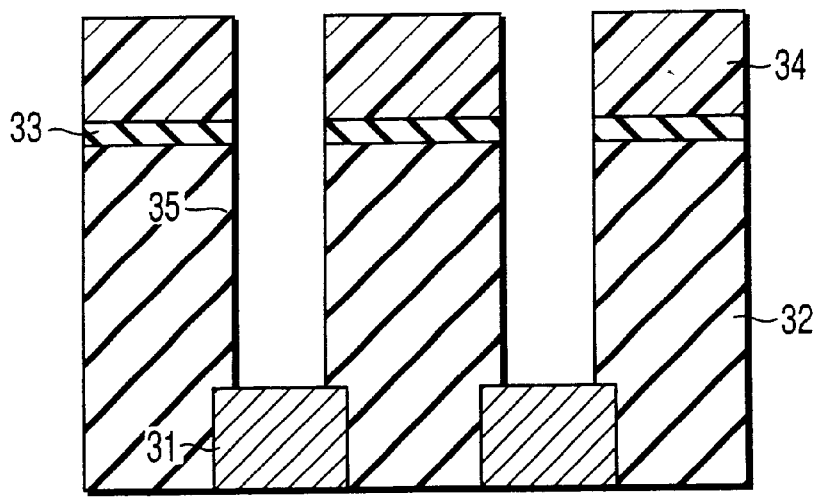
FIG. 14 is a cross sectional view showing a manufacturing step of a semiconductor device according to a second method of the conventional technology.
Figure 15:
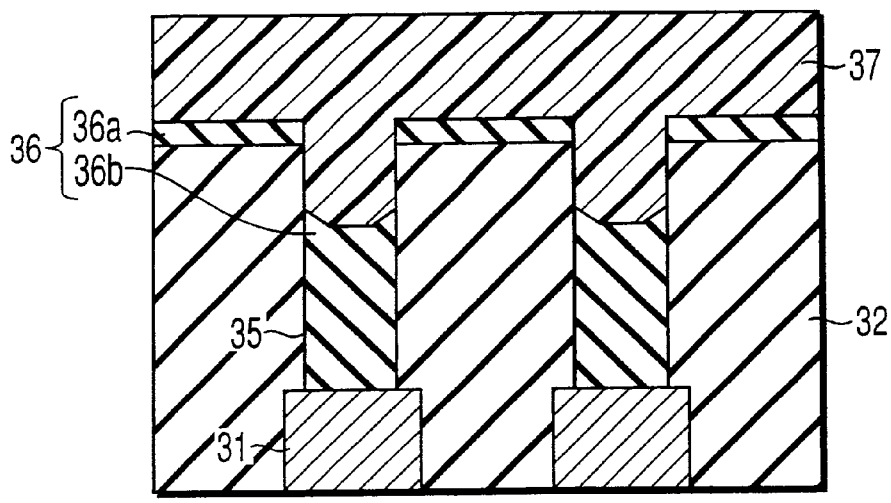
FIG. 15 is a cross sectional view showing a manufacturing step following the step shown in FIG. 14 of a semiconductor device according to the second method of the conventional technology.
Figure 16:
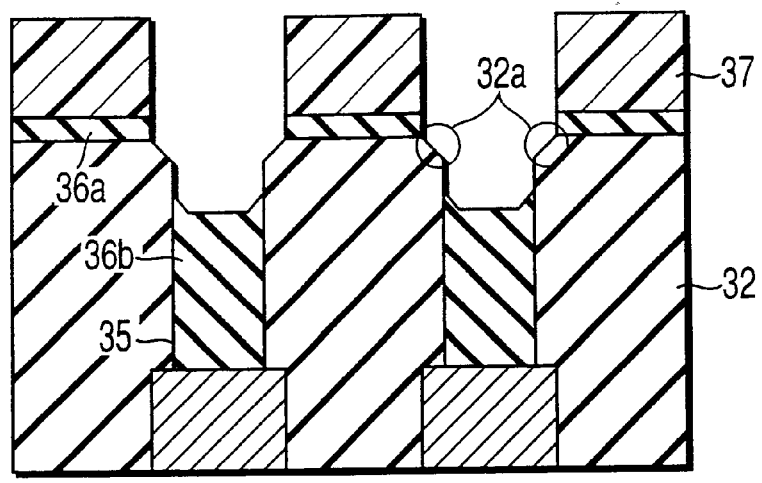
FIG. 16 is a cross sectional view showing a manufacturing step following the step shown in FIG. 15 of a semiconductor device according to the second method of the conventional technology.
Figure 17:
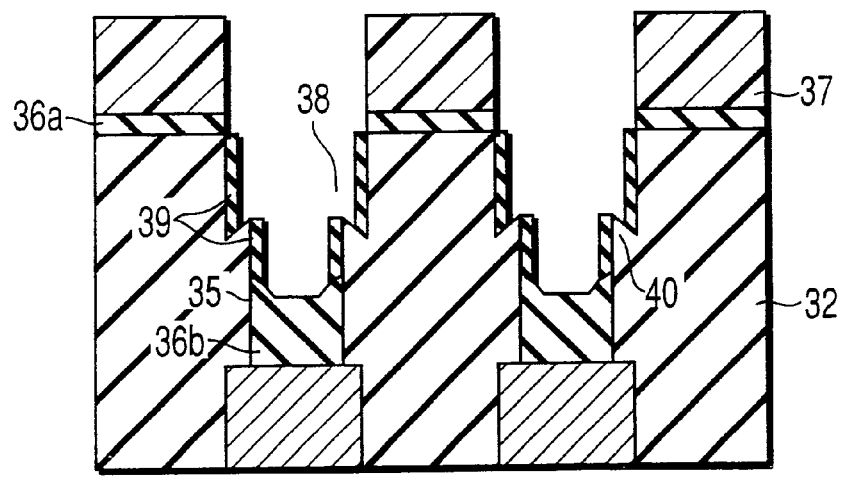
FIG. 17 is a cross sectional view showing a manufacturing step following the step shown in FIG. 16 of a semiconductor device according to the second method of the conventional technology.

Finally, the lower layer 20a of the antireflection film is removed completely by ashing or treatment with a chemical solution so as to form the groove 19 in the second interlayer film 18, as shown in FIG. 10.

According to the second embodiment of the present invention, fine processing can be performed for forming the contact hole 15 and the groove 19 as in the first embodiment described previously.

Also, in the second embodiment, it suffices for the resist film 17 to perform the function of a mask in processing the upper film 20b of the antireflection film, making it possible to decrease the thickness of the resist film 17. It follows that the second embodiment provides an effective measure in the case where it is necessary to decrease the thickness of the resist film for ensuring a DOF (Depth Of Focus) in the light exposure step in accordance with further progress of miniaturization.

Also, where the width of the groove 19 is diminished, it is necessary to increase the depth of the groove 19, or to increase the thickness of the wiring, in order to decrease the resistance of the wiring formed within the groove 19. In this case, the depth of the groove 19 is determined in the second embodiment by the thickness of the lower film 20a of the antireflection film. Since the increase in the thickness of the lower film 20a is less limited, the thickness of the lower film 20a can be controlled easily. It follows that the second embodiment permits improving the degree of freedom in controlling the depth of the groove 19 so as to make it possible to process more finely the groove 19.

In the second embodiment described above, the lower film 20a of the antireflection film is formed of an organic film, with the upper film 20b of the antireflection film being formed of an SOG film. However, the materials of the upper and lower films of the antireflection film are not limited to an organic film and an SOG film. If suffices for the lower film 20a to be capable of selective removal relative to the first and second interlayer films 12, 18 and the lower layer wiring 11. Also, it suffices for the upper film 20b to be a film exhibiting a selectivity of RIE relative to the lower film 20a and to be a film exhibiting a polishing rate in CMP not lower than that of the second interlayer film 18.

Further, it is possible to remove the resist film 17 after patterning of the upper film 20b and the lower film 20a. However, it is desirable to remove the resist film 17 together with the second interlayer film 18 and the upper film 20b in the step of exposing at least the entire surface of the lower film 20a to the outside shown in FIG. 9.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

selectively forming a wiring;

forming a first interlayer film on the wiring;

forming a first antireflection film on the first interlayer film;

forming a first resist film on the first antireflection film;

patterning the first resist film, followed by removing the first antireflection film and the first interlayer film with the patterned first resist film used as a mask so as to form a contact hole exposing a portion of the top surface of the wiring to the outside;

removing the first resist film;

forming a second antireflection film so as to cover at least the bottom surface of the contact hole;

forming a second resist film on the second antireflection film;

patterning the second resist film to permit the second resist film to remain over the contact hole;

removing the second antireflection film with the patterned second resist film used as a mask so as to expose a portion of the top surface of the first interlayer film to the outside;

forming a second interlayer film so as to cover the patterned second resist film and the second antireflection film;

removing the second interlayer film so as to expose at least the entire top surface of the patterned second resist film to the outside; and removing the patterned second resist film and the second antireflection film so as to form a groove in the second interlayer film.

2. The method of manufacturing a semiconductor device according to claim 1, wherein said second interlayer film is formed of an SOG film.

3. The method of manufacturing a semiconductor device according to claim 1, wherein said second interlayer film is formed of a film having a dielectric constant lower than that of the first interlayer film.

4. The method of manufacturing a semiconductor device according to claim 1, wherein said second interlayer film is formed of a film of a coating type.

5. The method of manufacturing a semiconductor device according to claim 1, wherein each of said first and second antireflection films is formed of an organic film.

6. A method of manufacturing a semiconductor device, comprising the steps of:

selectively forming a wiring;

forming a first interlayer film on the wiring;

forming a first antireflection film on the first interlayer film;

forming a first resist film on the first antireflection film;

patterning the first resist film, followed by removing the first antireflection film and the first interlayer film with the patterned first resist film used as a mask so as to form a contact hole exposing a portion of the top surface of the wiring to the outside;

removing the first resist film;

forming a lower film of a second antireflection film so as to fill the contact hole;

forming an upper film of the second antireflection film on the lower film of the second antireflection film;

forming a second resist film on the upper film of the second antireflection film;

patterning the second resist film to permit the second resist film to remain over the contact hole;

patterning the upper film of the second antireflection film with the patterned second resist film used as a mask;

patterning the lower film of the second antireflection film with the patterned upper film of the second antireflection film used as a mask so as to expose a portion of the top surface of the first interlayer film to the outside;

forming a second interlayer film so as to cover the upper film and the lower film of the second antireflection film;

removing the second interlayer film and the upper film of the second antireflection film so as to expose at least the entire upper surface of the lower film of the second antireflection film; and removing the lower film of the second antireflection film so as to form a groove in the second interlayer film.

7. The method of manufacturing a semiconductor device according to claim 6, wherein each of said second interlayer film and said upper film of the second antireflection film is formed of an SOG film.

8. The method of manufacturing a semiconductor device according to claim 6, wherein said second interlayer film is formed of a film having a dielectric constant lower than that of the first interlayer film.

9. The method of manufacturing a semiconductor device according to claim 6, wherein said second interlayer film is formed of a film of a coating type.

10. The method of manufacturing a semiconductor device according to claim 6, wherein each of said first antireflection film and said lower film of the second antireflection film is formed of an organic film.

11. The method of manufacturing a semiconductor device according to claim 6, wherein the upper film and the lower film of said second antireflection film are patterned simultaneously with the patterned second resist film used as a mask.

12. The method of manufacturing a semiconductor device according to claim 6, wherein the second interlayer film is formed with the second resist film left unremoved, and the second resist film is removed together with the second interlayer film and the upper film of the second antireflection film in the step of exposing at least the entire upper surface of the lower film of the second antireflection film to the outside.

* * * * *